US008103025B2

(12) United States Patent
Mullenborn et al.

(10) Patent No.: US 8,103,025 B2
(45) Date of Patent: Jan. 24, 2012

(54) SURFACE MOUNTABLE TRANSDUCER SYSTEM

(75) Inventors: Matthias Mullenborn, Lyngby (DK); Jochen F. Kuhmann, Copenhagen (DK); Peter Scheel, Gentofte (DK)

(73) Assignee: Epcos PTE Ltd., Singapore (SG)

( * ) Notice: Subject to any disclaimer, the term of this patent is extended or adjusted under 35 U.S.C. 154(b) by 1449 days.

(21) Appl. No.: 11/320,612

(22) Filed: Dec. 30, 2005

(65) Prior Publication Data

US 2006/0115102 A1 Jun. 1, 2006

Related U.S. Application Data

(60) Division of application No. 10/323,757, filed on Dec. 20, 2002, now Pat. No. 7,221,767, which is a continuation of application No. 09/570,434, filed on May 12, 2000, now Pat. No. 6,522,762, which is a continuation-in-part of application No. 09/391,628, filed on Sep. 7, 1999, now abandoned.

(51) Int. Cl.
*H04R 25/00* (2006.01)
*H04R 19/00* (2006.01)
*H01L 29/84* (2006.01)
*H01L 21/70* (2006.01)
*H01L 23/12* (2006.01)
*G10K 9/12* (2006.01)

(52) U.S. Cl. ........ 381/174; 381/173; 381/181; 381/175; 381/191; 257/416; 257/704; 257/499; 257/522; 367/181; 367/174

(58) Field of Classification Search .................. 381/100, 381/181, 361–365, 171–175, 191; 257/704, 257/729, 416, 522, 499; 367/174, 181
See application file for complete search history.

(56) References Cited

U.S. PATENT DOCUMENTS

| | | | | |
|---|---|---|---|---|
| 3,586,922 | A | 6/1971 | Johnson et al. | |
| 3,624,315 | A | 11/1971 | Broce et al. | |
| 4,129,042 | A * | 12/1978 | Rosvold | 73/727 |
| 4,225,755 | A | 9/1980 | Block | |
| 4,356,047 | A | 10/1982 | Gordon et al. | |
| 4,533,795 | A | 8/1985 | Baumhauer, Jr. et al. | |
| 4,885,781 | A | 12/1989 | Seidel | |
| 4,908,805 | A | 3/1990 | Sprenkels et al. | |
| 4,922,471 | A | 5/1990 | Kuehnel | |
| 5,146,435 | A | 9/1992 | Bernstein | |

(Continued)

FOREIGN PATENT DOCUMENTS

DE 3325961 1/1985

(Continued)

OTHER PUBLICATIONS

International Search Report for PCT/DK00/00491 mailed Nov. 28, 2000.

(Continued)

*Primary Examiner* — Devona Faulk
(74) *Attorney, Agent, or Firm* — Nixon Peabody LLP

(57) ABSTRACT

The present invention relates to a surface mountable acoustic transducer system, comprising one or more transducers, a processing circuit electrically connected to the one or more transducers, and contact points arranged on an exterior surface part of the transducer system. The contact points are adapted to establish electrical connections between the transducer system and an external substrate, the contact points further being adapted to facilitate mounting of the transducer system on the external substrate by conventional surface mounting techniques.

42 Claims, 7 Drawing Sheets

U.S. PATENT DOCUMENTS

| | | | | |
|---|---|---|---|---|
| 5,265,470 | A | 11/1993 | Kaiser et al. | |
| 5,272,758 | A | 12/1993 | Isogami et al. | |
| 5,303,210 | A | 4/1994 | Bernstein | |
| 5,365,937 | A * | 11/1994 | Reeves et al. | 600/528 |
| 5,452,268 | A | 9/1995 | Bernstein | |
| 5,490,220 | A | 2/1996 | Loeppert | |
| 5,531,787 | A | 7/1996 | Lesinski et al. | |
| 5,573,679 | A | 11/1996 | Mitchell et al. | |
| 5,659,195 | A | 8/1997 | Kaiser et al. | |
| 5,677,965 | A | 10/1997 | Moret et al. | |
| 5,699,611 | A | 12/1997 | Kurogi et al. | |
| 5,856,914 | A | 1/1999 | O'Boyle | |
| 5,870,482 | A | 2/1999 | Loeppert et al. | |
| 5,888,845 | A | 3/1999 | Bashir et al. | |
| 5,889,872 | A | 3/1999 | Sooriakumar et al. | |
| 5,907,625 | A | 5/1999 | Kanai et al. | |
| 6,009,753 | A | 1/2000 | Tsang et al. | |
| 6,088,463 | A * | 7/2000 | Rombach et al. | 381/174 |
| 6,178,249 | B1 | 1/2001 | Hietanen et al. | |
| 6,658,938 | B2 * | 12/2003 | McIntosh | 73/514.32 |
| 7,221,768 | B2 * | 5/2007 | Sjursen et al. | 381/322 |

FOREIGN PATENT DOCUMENTS

| | | | |
|---|---|---|---|
| EP | 0451992 | A2 | 10/1991 |
| EP | 0561566 | A2 | 3/1992 |
| EP | 0531613 | A2 | 3/1993 |
| EP | 0561566 | A2 | 9/1993 |
| EP | 561566 | A2 * | 9/1993 |
| EP | 0490486 | | 1/1996 |
| EP | 0783108 | | 7/1997 |
| JP | 60-120516 | | 6/1985 |
| JP | 4294234 | | 10/1992 |
| JP | 06-258342 | | 9/1994 |
| JP | 07-050899 | | 2/1995 |
| JP | 07-274287 | | 10/1995 |
| JP | 10-096745 | | 4/1998 |
| JP | 2001-54196 | | 2/2001 |
| JP | 09-037382 | | 2/2009 |
| WO | WO 94/25863 | | 11/1994 |
| WO | WO 95/34917 | | 12/1995 |
| WO | WO97/01258 | | 1/1997 |
| WO | 98/30878 | A1 | 7/1998 |
| WO | 98/40712 | A1 | 9/1998 |

OTHER PUBLICATIONS

"Forste Silicium-Baserede Mikro-Mikrofon" (First Silicon-Based Miniature Microphones) by Lars Kristiansen, Elektronik & Data, No. 3, Mar. 1998, pp. 4, 6 and 8.

Jeffrey T. Butler et al., "Multichip module packaging of microelectromechanical systems, Sensors and Actuators", A 70 (1998), pp. 15-22.

K. W. Markus et al., "Smart Mems: Flip Chip Integration of mems and Electronics", SPIE, vol. 2448, pp. 82-92.

F. Mayer et al., "Flip-Chip Packaging for Smart MEMS", SPIE, vol. 3328, pp. 183-193.

Michael M. Maharbiz et al., "Batch Micropackaging by Compression-Bonded Wafer-Wafer Transfer".

T. Gebner et al., "Bonding and Metallization for a High Precision Acceleration Sensor", Electrochemical Society Proceedinsgs, vol. 95-27, pp. 297-308.

* cited by examiner

SURFACE MOUNTABLE TRANSDUCER SYSTEM

CROSS-REFERENCE TO RELATED APPLICATIONS

This is a divisional of, and claims priority under 35 U.S.C. §120 to, U.S. application Ser. No. 10/323,757, filed Dec. 20, 2002 now U.S. Pat. No. 7,221,767, which is a continuation of, and further claims priority under 35 U.S.C. §120 to U.S. application Ser. No. 09/570,434, filed May 12, 2000 now U.S. Pat. No. 6,522,762, which is a continuation-in-part of, and further claims priority under 35 U.S.C. §120 to U.S. application Ser. No. 09/391,628, filed Sep. 7, 1999 now abandoned.

FIELD OF INVENTION

The present invention relates to a sensor system comprising a carrier member, a transducer element and an electronic device. The present invention relates in particular to condenser microphone systems assembled using flip-chip technology. The present invention further relates to condenser microphone systems adapted for surface mounting on e.g. printed circuit boards (PCB's).

BACKGROUND OF THE INVENTION

In the hearing instrument and mobile communication system industry, one of the primary goals is to make components of small sizes while still maintaining good electroacoustic performance and operability giving good user friendliness and satisfaction. Technical performance data include sensitivity, noise, stability, compactness, robustness and insensitivity to electromagnetic interference (EMI) and other external and environmental conditions. In the past, several attempts have been made to make microphone systems smaller while maintaining or improving their technical performance data.

Another issue within these component industries concerns the ease of integration into the complete system.

EP 561 566 discloses a solid state condenser microphone having a field effect transistor (FET) circuitry and a cavity or sound inlet on the same chip. The techniques and processes for manufacturing a FET circuitry are quite different from the techniques and processes used in manufacturing transducer elements. Consequently, the transducer element and FET system disclosed in EP 561 566 requires two (or possibly more) separate stages of production which by nature makes the manufacturing more complicated and thereby also more costly.

The article "The first silicon-based micro-microphone" published in the Danish journal Elektronik og Data, No. 3, p. 4-8, 1998 discloses how silicon-based microphone systems can be designed and manufactured. The article discloses a three-layer microphone system where a transducer element is flip-chip mounted on an intermediate layer connecting the transducer element to an electronic device, such as an ASIC. The transducer element comprises a movable diaphragm and a substantially stiff back plate. On the opposite side of the transducer element a silicon-based structure forming a back chamber is mounted. It is worth noting that in order for the microphone system to be electrically connected to the surroundings wire bonding or direct soldering is required.

The development of combined microelectromechanical systems (MEMS) has progressed significantly over the last years. This has primarily to do with the development of appropriate techniques for manufacturing such systems. One of the advantages of such combined systems relates to the size with which relative complicated systems involving mechanical micro-transducers and specially designed electronics may be manufactured.

It is an object of the present invention to provide a sensor system where the different elements forming the sensor system are flip-chip mounted, applying standard batch-oriented techniques.

It is a further object of the present invention to provide a sensor system suitable for mounting on e.g. PCB's using flip-chip or surface mount technologies and thereby avoid wire bonding or complicated single-chip handling.

It is a still further object of the present invention to provide a sensor system where the distance between the transducer element and the electronics is reduced so as to reduce parasitics and space consumption.

SUMMARY OF THE INVENTION

The above-mentioned objects are complied with by providing, in a first aspect, a sensor system comprising

- a carrier member having a first surface, said first surface holding a first and a second group of contact elements,
- a transducer element comprising an active member and at least one contact element, said at least one contact element being aligned with one of the contact elements of the first group so as to obtain electrical contact between the transducer element and the carrier member, and
- an electronic device comprising an integrated circuit and at least one contact element, said at least one contact element being aligned with one of the contact elements of the second group so as to obtain electrical contact between the electronic device and the carrier member, wherein at least one of the contact elements of the first group is electrically connected to at least one of the contact elements of the second group so as to obtain electrical contact between the transducer element and the electronic device.

The transducer element may in principle be any kind of transducer, such as a pressure transducer, an accelerometer or a thermometer.

In order for the sensor system to communicate with the surroundings the carrier member may further comprise a second surface, said second surface holding a plurality of contact elements. At least one of the contact elements of the first or second group is electrically connected to one of the contact elements being held by the second surface. The first and second surfaces may be substantially parallel and opposite each other.

The carrier member and the transducer element may be based on a semiconductor material, such as Si. In order to decouple thermal stresses, the carrier member, the transducer element and the electronic device may be based on the same semiconductor material. Again, the material may be Si.

In order to form a back chamber for microphone applications the carrier member may further comprise an indentation aligned with the active member of the transducer element. Also for microphone applications the active member of the transducer element may comprise a capacitor being formed by a flexible diaphragm and a substantially stiff back plate. Furthermore, the transducer element further comprises a cavity or sound inlet. The bottom of the cavity may be defined or formed by the active member of the transducer element. The flexible diaphragm and the substantially stiff back plate may be electrically connected to a first and a second contact element of the transducer element, respectively, in order to transfer the signal received by the transducer element to the carrier member.

The integrated circuit may be adapted for signal processing. This integrated circuit may be an ASIC. The integrated circuit is operationally connected to the at least one contact element of the electronic device.

In order to obtain directional sensitivity the sensor may further comprise an opening or sound inlet between the second surface of the carrier member and the indentation.

In order to protect the transducer element against e.g. particles or humidity an outer surface of the sensor is at least partly protected by a lid. The lid and the active member of the transducer element may define an upper and lower boundary of the cavity, respectively. Furthermore, at least one outer surface of the sensor system may hold a conductive layer. The conductive layer may comprise a metal layer or a conductive polymer layer.

The contact elements may comprise solder materials, such as a Sn, SnAg, SnAu or SnPb. Furthermore, the sensor system may comprise sealing means for hermetically sealing the transducer element.

In a second aspect, the present invention relates to a sensor system comprising

- a carrier member having a first surface, said first surface holding a first, a second and a third group of contact elements,
- a first transducer element comprising an active member and at least one contact element, said at least one contact element being aligned with one of the contact elements of the first group so as to obtain electrical contact between the first transducer element and the carrier member,
- a second transducer element comprising an active member and at least one contact element, said at least one contact element being aligned with one of the contact elements of the second group so as to obtain electrical contact between the second transducer element and the carrier member, and
- an electronic device comprising an integrated circuit and at least one contact element, said at least one contact element being aligned with one of the contact elements of the third group so as to obtain electrical contact between the electronic device and the carrier member, wherein at least one of the contact elements of the first group is electrically connected to at least one of the contact elements of the third group, and wherein at least one of the contact elements of the second is electrically connected to at least one of the contact elements of the third group so as to obtain electrical contact between the first transducer element and the electronic device and between the second transducer element and the electronic device.

The sensor according to the second aspect may be suitable for directional sensing, such as for directional sensitive pressure transducers.

The carrier member such as a Si-based carrier member, may further comprise a second surface holding a plurality of contact elements. In order to obtain electrical connection to the second surface at least one of the contact elements of the first, second or third group may be electrically connected to one of the contact elements being held by the second surface. The first and second surfaces may be substantially parallel and opposite each other. Preferably, the transducer elements and the electronic device are Si-based.

The carrier member may further comprise a first and a second indentation, the first indentation being aligned with the active member of the first transducer element, the second indentation being aligned with the active member of the second transducer element. The first and second indentations act as back chambers.

Each of the first and second transducer elements may further comprise a cavity, the bottom of said cavities being defined by the active members of the first and second transducer elements.

In order to measure e.g. pressure variations each of the active members of the first and second transducer elements may comprise a capacitor, said capacitor being formed by a flexible diaphragm and a substantially stiff back plate, said flexible diaphragm and said substantially stiff back plate being electrically connected to contact elements of the respective transducer elements.

Each of the first and second transducer elements further may comprise a lid for protecting the transducer elements. The lids and the active members of the first and second transducer elements may be positioned in such a way that they define an upper and a lower boundary of the respective cavities.

At least part of an outer surface of the sensor system may hold a conductive layer. This conductive layer may be a metal layer a conductive polymer layer. The contact elements may comprise a solder material, such as Sn, SnAg, SnAu or SnPb.

Solid state silicon-based condenser microphone systems according to the invention are suitable for batch production. The combination of the different elements forming the microphone system is more flexible compared to any other system disclosed in the prior art. The present invention makes it possible to provide a very well defined interface to the environment, e.g. by an opening on one side of the system. This opening can be covered by a film or filter preventing dust, moisture and other impurities from contaminating or obstructing the characteristics of the microphone. Electrical connections between the different elements of the microphone system are established economically and reliably via a silicon carrier using flip-chip technology.

The present invention uses an integrated electronic circuit chip, preferably an application specific integrated circuit (ASIC) which may be designed and manufactured separately and independent of the design and manufacture of the transducer element of the microphone. This is advantageous since the techniques and processes for manufacturing integrated electronic circuit chips are different from those used in manufacturing transducer elements, and each production stage can thus be optimised independently. Furthermore, testing of transducer elements and ASICs may be performed on wafer level.

The complete sensor system can be electrically connected to an external substrate by surface mount technology with the contacts facing one side of the system that is not in conflict with the above-mentioned interface to the environment. This allows the user to apply simple and efficient surface mount techniques for the assembly of the overall system.

BRIEF DESCRIPTION OF THE DRAWINGS

The present invention will now be explained in further details with reference to the accompanying drawings, where.

DETAILED DESCRIPTION OF THE INVENTION

The process used for manufacturing the different elements of the sensor system involves mainly known technologies within the field of microtechnology.

Figure 1:
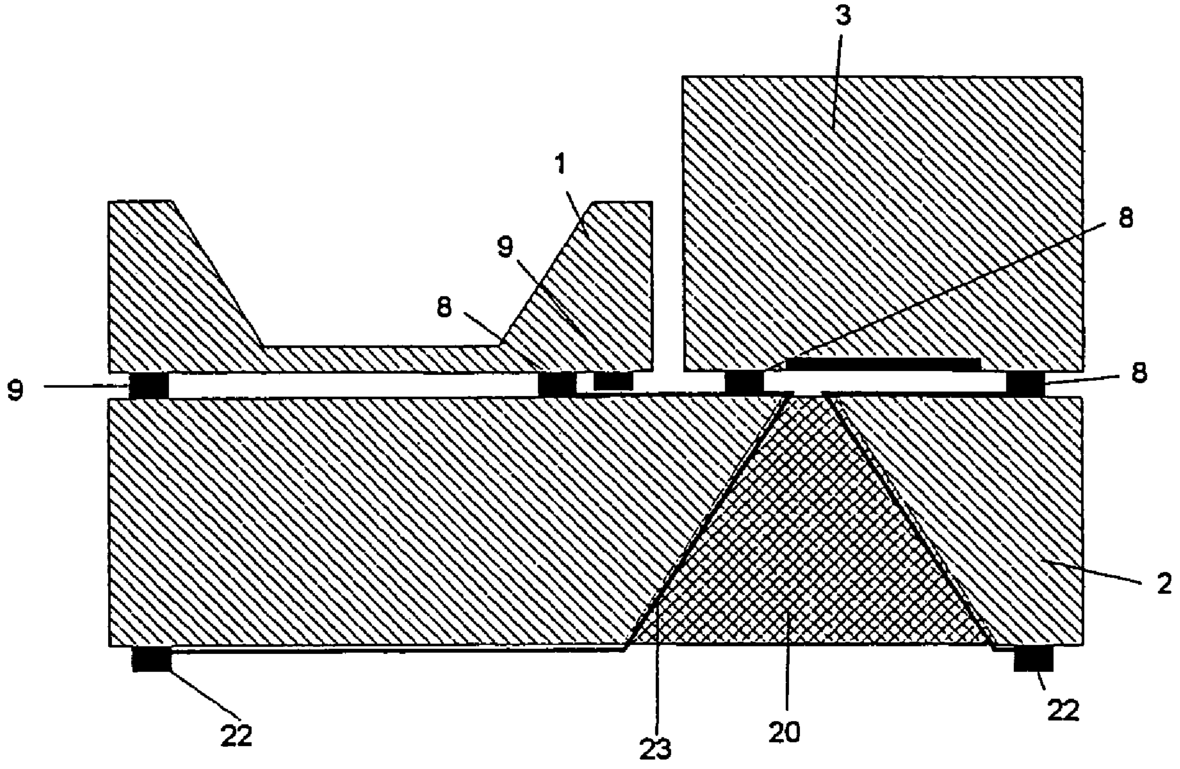
FIG. 1 is an illustration of a general application of a silicon-based sensor system.

In FIG. 1 a silicon carrier substrate 2 containing one or more vertical etched feed-through holes 20 is shown. The silicon carrier substrate 2, which is bulk crystalline silicon, has solder bumps 8, 22 on a first surface and a second surface, respectively. The electrical signal is carried from the first surface to the second surface via feed-through lines 23. On the first surface, one or more transducer elements 1 are flip-chip mounted onto the silicon carrier substrate 2, connected and fixed by a first group of solder bumps 8. Also on the first surface, one or more electronic devices, such as integrated circuit chips 3, are, flip-chip mounted onto the silicon carrier substrate 2, connected and fixed by a second group of solder bumps 8. The solder bump 8 material is typically Sn, SnAg, SnAu, or SnPb, but other metals could also be used.

A solder sealing ring 9 provides sealing for the transducer element 1. In this case, feed-through lines 23 are used for carrying the electrical signals from the transducer element 1 under the sealing ring 9 to the electronic device 3. This is shown in greater detail in FIG. 5. The signal can also be carried to the electronic circuit by other conductive paths. Electrical conductive paths 23 are also formed through the carrier e.g. by etching holes 20 and subsequent metallization. The etching can be done by wet chemical etching or dry plasma etching techniques. This path 23 is called a vertical feed-through and can be used for carrying the electrical signal from either the transducer 1 or the electronic circuit 3 to the second surface of the carrier.

The second surface is supplied with solder bumps 22 for surface mounting onto e.g. a PCB or another carrier.

Figure 2:
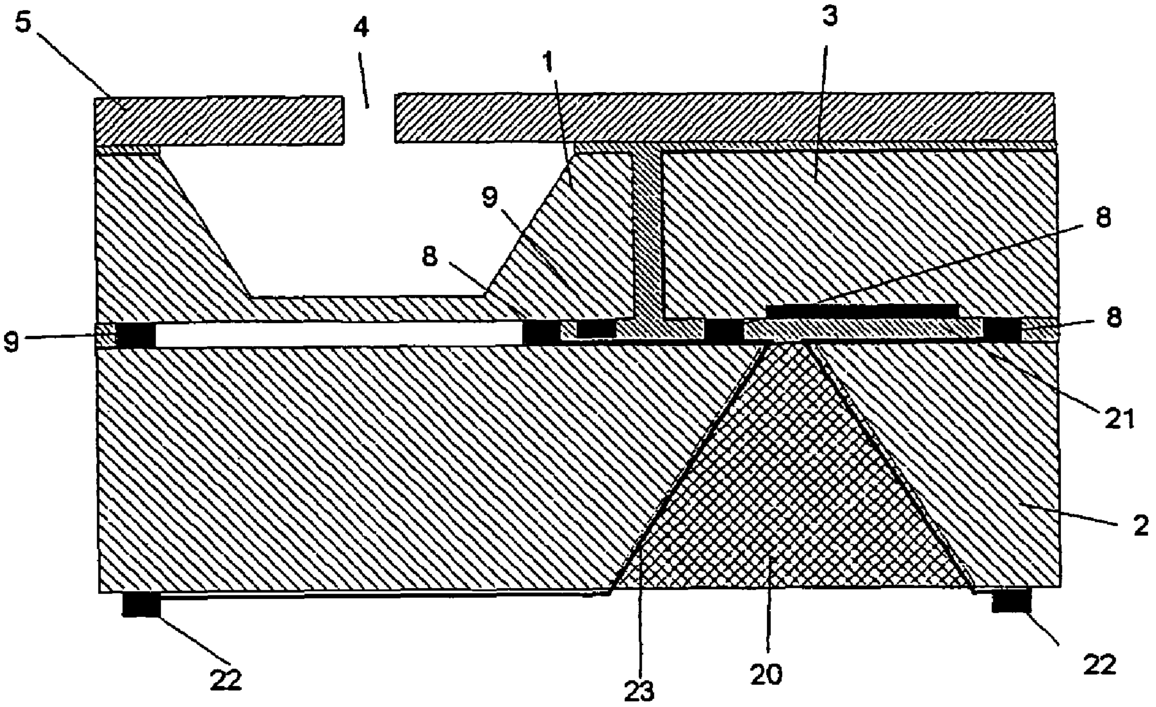
FIG. 2 is an illustration of a general application of a silicon-based sensor system with a lid.

FIG. 2 shows a package like the one shown in FIG. 1, but in this embodiment the electronic device 3 has been connected and fixed by one group of solder bumps 8 as well as other means such as underfill or glue 21. Furthermore, the package is protected by a lid 5, which is fixed to the flip-chip mounted transducer element 1 or electronic device 3 or both. The lid 5 has an opening 4 providing a well-determined access to the environment, e.g. a sound-transmitting grid or filter as protection against particles or humidity for a microphone. The lid can be made separately, e.g. from metal or polymer by punching or injection moulding, respectively.

Figure 3:
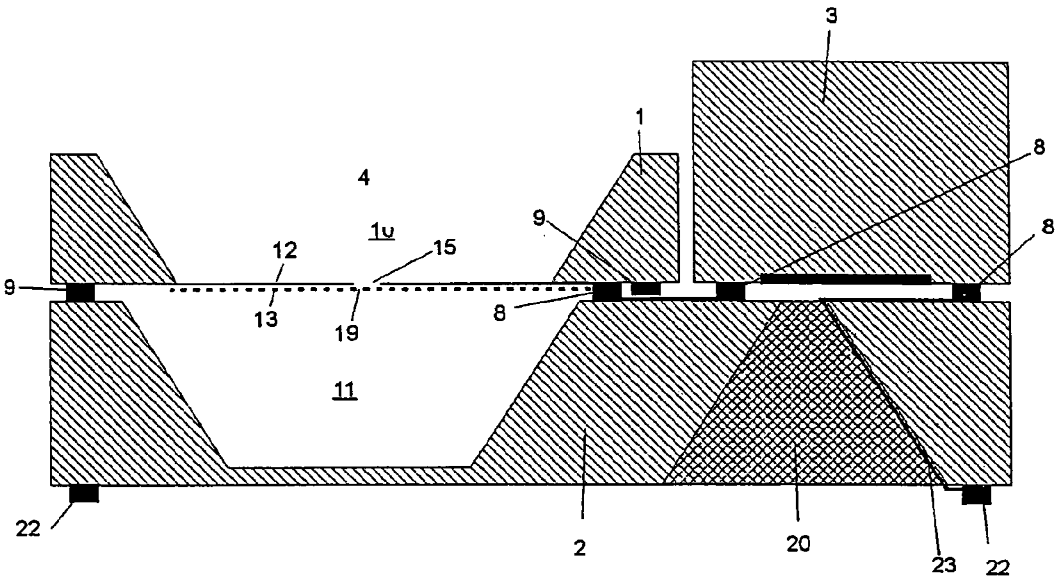
FIG. 3 is an illustration of a microphone application of the silicon-based sensor system.
Figure 4:
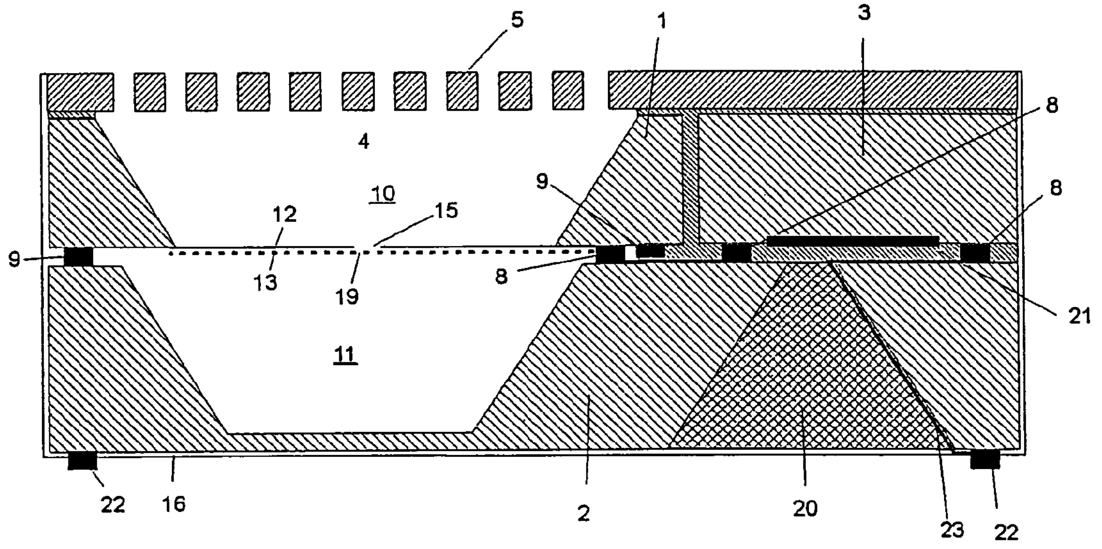
FIG. 4 is an illustration of an encapsulated microphone application.

In FIGS. 3 and 4 a system for microphone applications is shown. In these embodiments the transducer element 1 is a microphone and a back chamber 11 has been etched into the silicon substrate 2. The back chamber is etched into the silicon carrier by wet etching processes using reactants as KOH, TMAH or EDP or by dry etching processes such as reactive ion etching. The cavity 11 can be etched in the same step as the feed-through hole 20.

The difference between FIGS. 3 and 4 is that the system, in FIG. 4, has been encapsulated with a filter 5 for providing EMI-shielding. The EMI-shield 16 is a conductive polymer layer, such as silver epoxy or a metal layer, such as electroplated or evaporated Cu or Au. Furthermore, the integrated circuit chip 3 and the filter 5 in FIG. 4 have been connected and fixed with additional means such as underfill or glue 21.

The function of the microphone is as follows. The opening 4 functions as a sound inlet, and ambient sound pressure enters through the filter 5 covering the opening 4 to the cavity 10 functioning as a front chamber for the microphone. The sound pressure deflects the diaphragm 12, which causes the air between the diaphragm 12 and the back plate 13 to escape through the perforations 19.

The diaphragm may be designed and manufactured in different ways. As an example the diaphragm may be designed as a three-layer structure having two outer layers comprising silicon nitride whereas. the intermediate layer comprises polycrystalline silicon. The polycrystalline silicon comprised in the intermediate layer is doped with either boron (B) or phosphorous (P). the back plate also comprises B- or P-doped polycrystalline silicon and silicon nitride. The cavity 11 functions as a back chamber for the microphone.

When the diaphragm 12 is deflected in response to the incident sound pressure, the electrical capacity of the electrical capacitor formed by the diaphragm 12 and the back plate 13 will vary in response to the incident sound pressure. The circuit on the integrated circuit chip 3 is electrically connected to the diaphragm 12 and the back plate 13 through solder bumps 8. The circuit is designed to detect variations in the electrical capacity of the capacitor formed by the diaphragm 12 and the back plate 13. The circuit has electrical connections via the solder bumps 8 and the vertical feed-through lines 23 to the solder bumps 22 for electrically connecting it to a power supply and other electronic circuitry in e.g. a hearing instrument.

When operating the capacitor formed by the diaphragm 12 and the back plate 13, the back plate 13 is connected to a DC power supply in order to charge the back plate 13. When the capacitance varies due to distance variation between the diaphragm 12 and the back plate 13 in response to a varying sound pressure, an AC voltage is superimposed on top of the applied DC level. The amplitude of the AC voltage is a measured for the change in capacitance and thus also a measure for the sound pressure experienced by the diaphragm.

Figure 5:
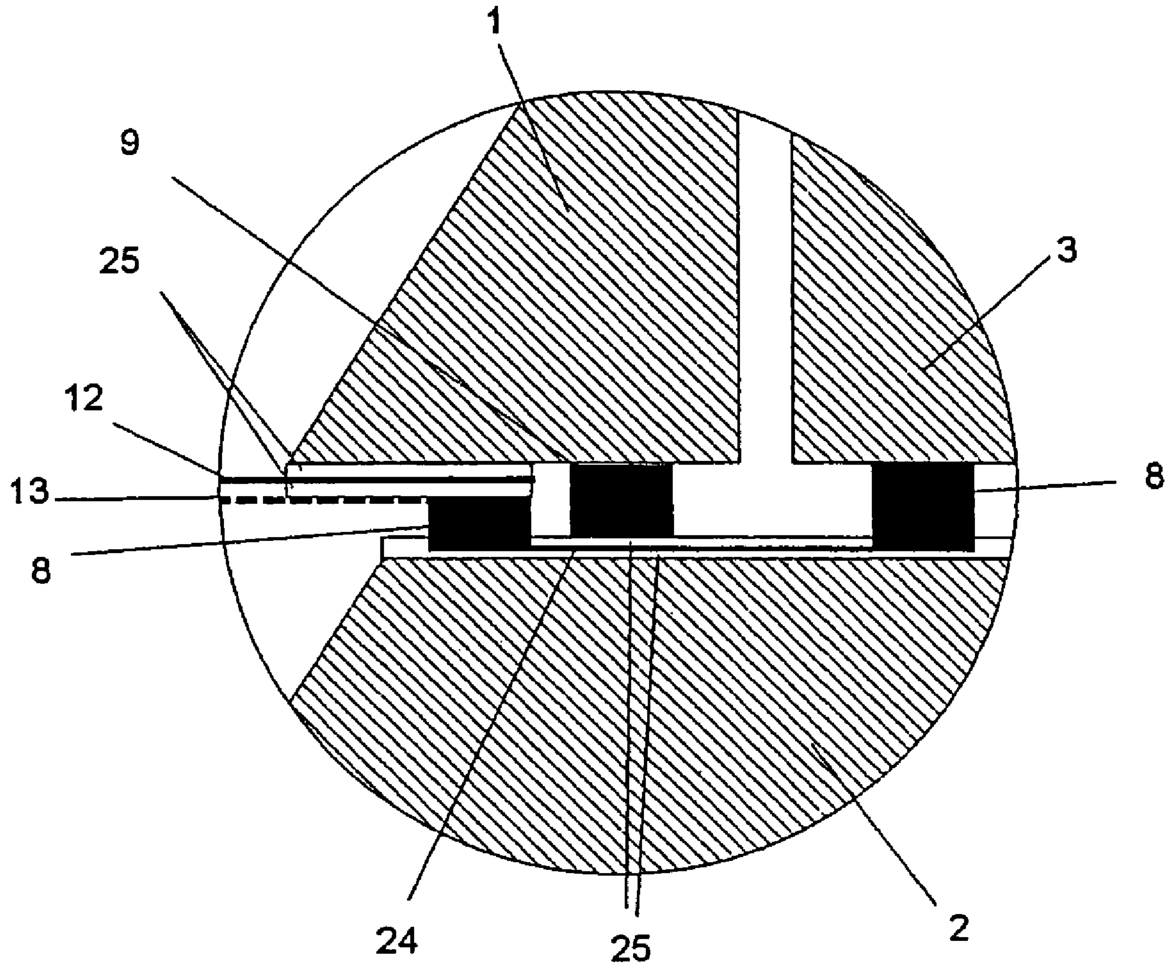
FIG. 5 is a close up of a lateral feed-through and sealing ring.

In FIG. 5 a close-up of a lateral feed-through line 24 and sealing ring 9 is shown. The feed-through 24 is electrically insulated from the sealing ring 9 and the substrate 2 by insulating layers 25. Insulating layers 25 similarly insulate the solder bumps 8 of the transducer 1 from the substrate 2. The solder bumps 8 of the transducer 1 and the solder bumps 8 of the circuit chip 3 are electrically connected via the feed-through line 24.

Figure 6:
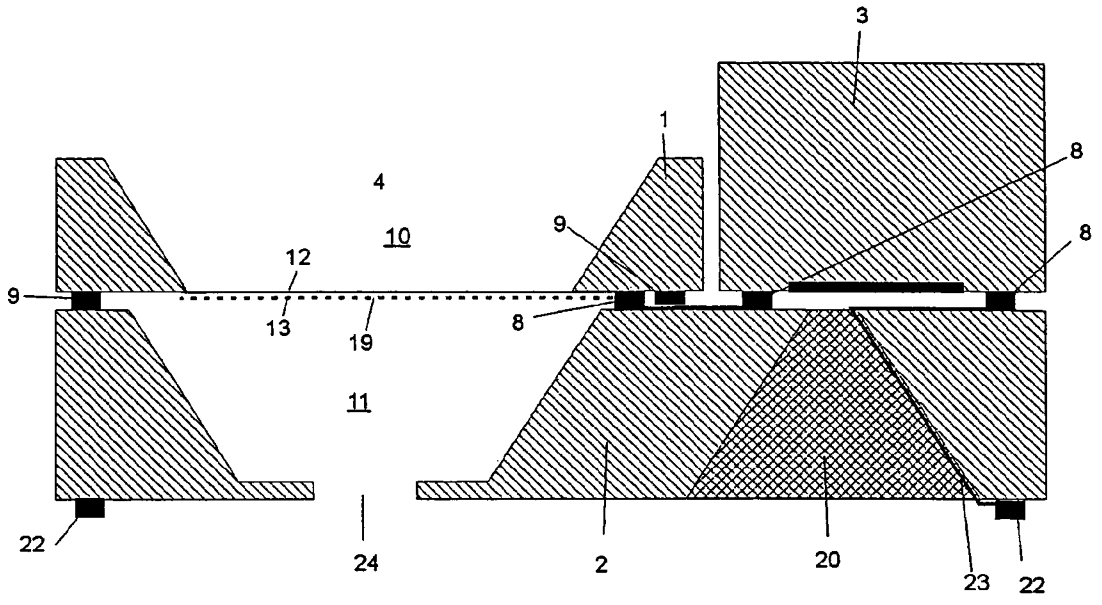
FIG. 6 is an illustration of a directional microphone application of the silicon-based sensor system.

In FIG. 6, a microphone similar to the one in FIG. 3 is shown. However, an opening 24 has been introduced in the backchamber 11. The opening 24 causes a membrane deflection that reflects the pressure gradient over the membrane resulting in a directional sensitivity of the microphone.

Figure 7:
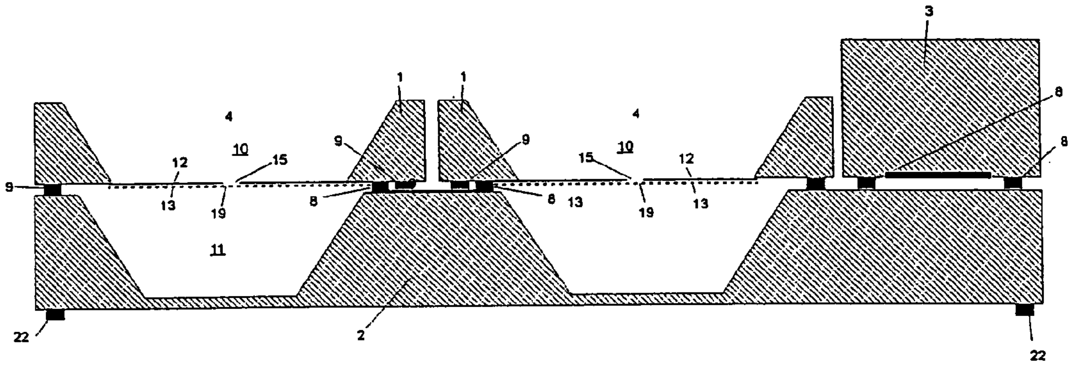
FIG. 7 is an illustration of a second directional microphone application of the silicon-based sensor system.

In FIG. 7, a microphone similar to the one in FIG. 3 is shown. However, an additional transducer element has been added so that the microphone now uses two transducer elements 1, both containing a membrane 12 and a backplate 13. Both transducer elements are connected to the carrier member 3 by solder bumps 8 and seal ring 9 with an indentation 11 for each transducer element. The two transducer elements allow to measure the phase difference of an impinging acoustical wave resulting in a directional sensitivity of the microphone.

It will be evident for the skilled person to increase the number of sensing elements from two (as shown in FIG. 7) to an arbitrary number of sensing elements—e.g. arranged in an array of columns and rows.

The invention claimed is:

1. A silicon condenser microphone, comprising:

a transducer element including a diaphragm;

a substrate including a surface having a recess formed therein, said transducer element overlapping at least a portion of said recess to form a volume adjacent to said transducer element, said transducer element including a cavity through which ambient sound pressure enters before deflecting said diaphragm;

a cover disposed over said cavity of said transducer element, said cover including a conductive portion forming a shield against electromagnetic interference, said cover having a length that is longer than a length of said diaphragm; and at least one aperture formed in said cover.

2. The silicon condenser microphone of claim 1, wherein said conductive portion includes a conductive layer formed in said cover.

3. The silicon condenser microphone of claim 1, wherein said conductive portion includes a conductive polymer layer.

4. The silicon condenser microphone of claim 1, further comprising solder bumps for electrically coupling to said transducer element.

5. The silicon condenser microphone of claim 1, wherein said at least one aperture includes an aperture formed in said substrate.

6. The silicon condenser microphone of claim 1, further comprising an environmental protection structure adjacent said at least one aperture.

7. The silicon condenser microphone of claim 6, further comprising a sealing ring coupled to said substrate for hermetically sealing said volume.

8. The silicon condenser microphone of claim 6, wherein said environmental protection structure includes a film.

9. The silicon condenser microphone of claim 6, said environmental protection structure includes a filter.

10. The silicon condenser microphone of claim 9, wherein said environmental protection structure is disposed over said at least one aperture.

11. The silicon condenser microphone of claim 1, wherein a portion of said cover includes an environmental protection structure.

12. The silicon condenser microphone of claim 11, wherein said environmental protection structure includes a metal.

13. The silicon condenser microphone of claim 1, wherein said volume is a back volume for said transducer element.

14. The silicon condenser microphone of claim 1, further comprising a sealing ring coupled to said substrate for hermetically sealing said volume.

15. The silicon condenser microphone of claim 1, further comprising a silicon-based integrated circuit on said substrate and electrically coupled to said transducer element, said cover being disposed over said integrated circuit.

16. The silicon condenser microphone of claim 1 in combination with a mobile phone.

17. The silicon condenser microphone of claim 1 in combination with a PDA.

18. The silicon condenser microphone of claim 1, wherein said transducer element includes a diaphragm having at least a silicon nitride layer and a polycrystalline silicon layer.

19. The silicon condenser microphone of claim 18, wherein said polycrystalline silicon layer is doped with boron.

20. The silicon condenser microphone of claim 18, wherein said polycrystalline silicon layer is doped with phosphorous.

21. The silicon condenser microphone of claim 1, wherein said transducer element includes a diaphragm having a silicon nitride layer.

22. The silicon condenser microphone of claim 1, further comprising a plurality of solder bumps disposed on a surface of said substrate opposite said surface having said recess, said solder bumps for surface mounting to a printed circuit board.

23. The silicon condenser microphone of claim 1, further comprising a housing at least partially enclosing said transducer element and said substrate.

24. The silicon condenser microphone of claim 23, wherein said housing includes a conductive layer protecting said transducer element against electromagnetic interference (EMI).

25. A silicon condenser microphone, comprising:

a transducer element including a diaphragm;

a substrate including a surface having a recess formed therein, said transducer element overlapping at least a portion of said recess to form a volume adjacent to said transducer element, said transducer element including a cavity through which ambient sound pressure enters before deflecting said diaphragm;

a multi-layer structure adjacent at least part of said transducer element, said multi-layer structure including a conductive layer and an insulating layer; and a cover disposed over said cavity and having a length that is longer than a length of said diaphragm.

26. The silicon condenser microphone of claim 25, wherein said substrate further includes a conductive portion that is electrically coupled to said conductive layer of said multi-layer structure.

27. The silicon condenser microphone of claim 26 in combination with a mobile phone.

28. The silicon condenser microphone of claim 26 in combination with a PDA.

29. The silicon condenser microphone of claim 26, further comprising a housing at least partially enclosing said transducer element and said substrate.

30. The silicon condenser microphone of claim 29, wherein said housing includes a conductive layer protecting said transducer element against electromagnetic interference (EMI).

31. A method of fabricating a silicon condenser microphone, comprising:

etching a recess into a substrate;

flip-chip mounting a silicon-based transducer element onto said substrate such that said transducer element overlaps at least a portion of said recess to form a volume adjacent to said transducer element, said transducer element including a diaphragm and a cavity through which ambient sound pressure enters before deflecting said diaphragm;

flip-chip mounting a silicon-based integrated circuit onto said substrate and adjacent to said transducer element;

attaching a cover over said cavity, said cover having a length that is longer than a length of said diaphragm; and forming at least one aperture in said cover.

32. The method of claim 31, wherein said etching is wet etching.

33. The method of claim 31, wherein said etching is dry etching.

34. The method of claim 31, further comprising etching an aperture into said substrate.

35. The method of claim 31, further comprising forming said cover by injection molding.

36. The method of claim 31, further comprising hermetically sealing said transducer element.

37. The method of claim 31, further comprising surface mounting said substrate onto a printed circuit board.

38. A method of fabricating a silicon condenser microphone, comprising:

etching a recess into a substrate;

flip-chip mounting a silicon-based transducer element onto said substrate such that said transducer element overlaps at least a portion of said recess to form a volume adjacent to said transducer element, said transducer element including a diaphragm and a cavity through which ambient sound pressure enters before deflecting said diaphragm;

attaching a cover over said cavity;

forming said cover by injection molding; and forming at least one aperture in said cover, said cover having a length that is longer than a length of said diaphragm.

39. The silicon condenser microphone of claim 25, wherein said volume is a back volume adjacent to a surface of said diaphragm, and wherein said cavity is a front volume, said cover completely covering said front volume.

40. The silicon condenser microphone of claim 25, wherein the transducer element includes a diaphragm and a backplate.

41. A silicon condenser microphone, comprising:

a transducer element having a diaphragm;

a substrate including a surface having a recess formed therein, said transducer element overlapping at least a portion of said recess to form a volume adjacent to said transducer element, said volume being a back volume adjacent to a surface of said diaphragm, said transducer element further defining a front volume adjacent to an opposite surface of said diaphragm through which ambient sound pressure enters before deflecting said diaphragm;

a multi-layer structure adjacent at least part of said transducer element, said multi-layer structure including a conductive layer and an insulating layer; and a cover completely covering said front volume.

42. The microphone of claim 41, wherein said cover has a length that is longer than a length of said diaphragm.

* * * * *